(12) United States Patent
LeBlanc

(10) Patent No.: US 7,176,715 B1
(45) Date of Patent: Feb. 13, 2007

(54) COMPUTER COMBINATORIAL MULTIPLIERS IN PROGRAMMABLE LOGIC DEVICES

(75) Inventor: Marcel LeBlanc, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 90 days.

(21) Appl. No.: 10/982,333

(22) Filed: Nov. 4, 2004

(51) Int. Cl.
   *H03K 19/173* (2006.01)
(52) U.S. Cl. .............. 326/38; 326/37; 326/40
(58) Field of Classification Search ........... 326/37–41, 326/46
   See application file for complete search history.

(56) References Cited

U.S. PATENT DOCUMENTS

| | | | |
|---|---|---|---|
| 5,804,990 A | * | 9/1998 | Popat et al. ............... 326/114 |
| 6,346,824 B1 | * | 2/2002 | New ........................... 326/39 |
| 6,556,043 B2 | * | 4/2003 | Garcia ........................ 326/40 |

* cited by examiner

*Primary Examiner*—Anh Q. Tran
(74) *Attorney, Agent, or Firm*—Beyer Weaver & Thomas, LLP

(57) ABSTRACT

Disclosed is a device and method for configuring a register in a PLD to operate as a logical AND gate. So configuring a register allows it to be used in a multiplication carried out by the PLD. A logic element includes a combinatorial logic section and at least one register interconnected with the combinatorial logic section. The register is configured to operate as a logical AND gate. The logic element can include a data input, a clear input, and a load input wherein the load input can be held high, a first bit to be ANDed can be input on the data input and a second bit to be ANDed can be input on the clear input. The logic element can, for example be configured to carry out at least a portion of a multiplication of a multiplicand and a multiplier.

15 Claims, 4 Drawing Sheets

(Multiplicand) $A_{N-1} A_{N-2} A_{N-3} \ldots A_2 A_1 A_0$ ×
(Multiplier) $B_{M-1} B_{M-2} B_{M-3} \ldots B_2 B_1 B_0$ (Partial Product) $PP^0_{N-1} \ldots PP^0_2 \; PP^0_1 \; PP^0_0$ +
$PP^1_{N-1} \ldots PP^1_2 \; PP^1_1 \; PP^1_0$ $PP^{K-1}_{N-1} \ldots PP^{K-1}_2 \; PP^{K-1}_1 \; PP^{K-1}_0$ $R_{N+M-1} R_{N+M-2} R_{N+M-3} \ldots R_2 \; R_1 \; R_0$

| Data | Clra | Q |
|---|---|---|
| 0 | 0 | 0 |
| 0 | 1 | 0 |
| 1 | 0 | 0 |
| 1 | 1 | 1 |

COMPUTER COMBINATORIAL MULTIPLIERS IN PROGRAMMABLE LOGIC DEVICES

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A COMPACT DISK APPENDIX

Not applicable.

BACKGROUND OF THE INVENTION

The present invention relates to configuration of logic elements for use with programmable logic devices or other similar devices.

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include one or more look-up tables (LUTs) or product terms, carry-out chains, registers, and other elements. A typical LUT circuit used as a logic element provides an output signal that is a function of multiple input signals. The particular logic function may be determined by programming the LUT's memory elements. Additionally, LEs typically include registers to perform sequential logic functions. However, it is sometimes the case the logic function carried out by an LE does not require a register. As such, registers in LEs may remain unused in a particular configuration, thereby reducing the density of the logic in a configuration.

One such example of a logic function that may be carried out by a PLD is a multiplication of two numbers. Such multiplier configurations can require the configuration of individual single bit multipliers followed by a series of adders. These single bit multipliers and adders are generally configured using the LUTs of a PLD. In such a case, the registers are not typically used for the multiplication function and, thus, may go unused altogether.

BRIEF SUMMARY OF THE INVENTION

Disclosed is a device and method for configuring a register in a PLD to operate as a logical AND gate. So configuring a register allows it to be used in a multiplication carried out by the PLD. In particular, in accordance with the present invention, a logic element includes a combinatorial logic section and at least one register interconnected with the combinatorial logic section. The register is configured to operate as a logical AND gate. The logic element can include a data input, a clear input, and a load input wherein the load input is held high, a first bit to be ANDed is input on the data input and a second bit to be ANDed is input on the clear input. The logic element can, for example be configured to carry out at least a portion of a multiplication of a multiplicand and a multiplier.

DETAILED DESCRIPTION OF THE INVENTION

Figure 1:
FIG. 1 illustrates an algorithm for carrying out the multiplication of two numbers.

FIG. 1 illustrates an algorithm 100 for carrying out an unsigned multiplication of a first number A that is N bits wide, the multiplicand, by a second number B that is M bits wide, the multiplier. The algorithm involves two steps: First, calculating the partial products, $PP^{K-1} \ldots PP^2, PP^1, PP^0$, $0 \leq K \leq M$, based on the bits of the multiplicand and the multiplier; and second, adding the partial products together to yield the final result. The $k^{th}$ partial product is calculated by multiplying bit $B_k$ by all the bits of number A. Additionally, prior to summing, each partial product must be shifted to the left by 1 bit with respect to the previous partial product.

Figure 2:
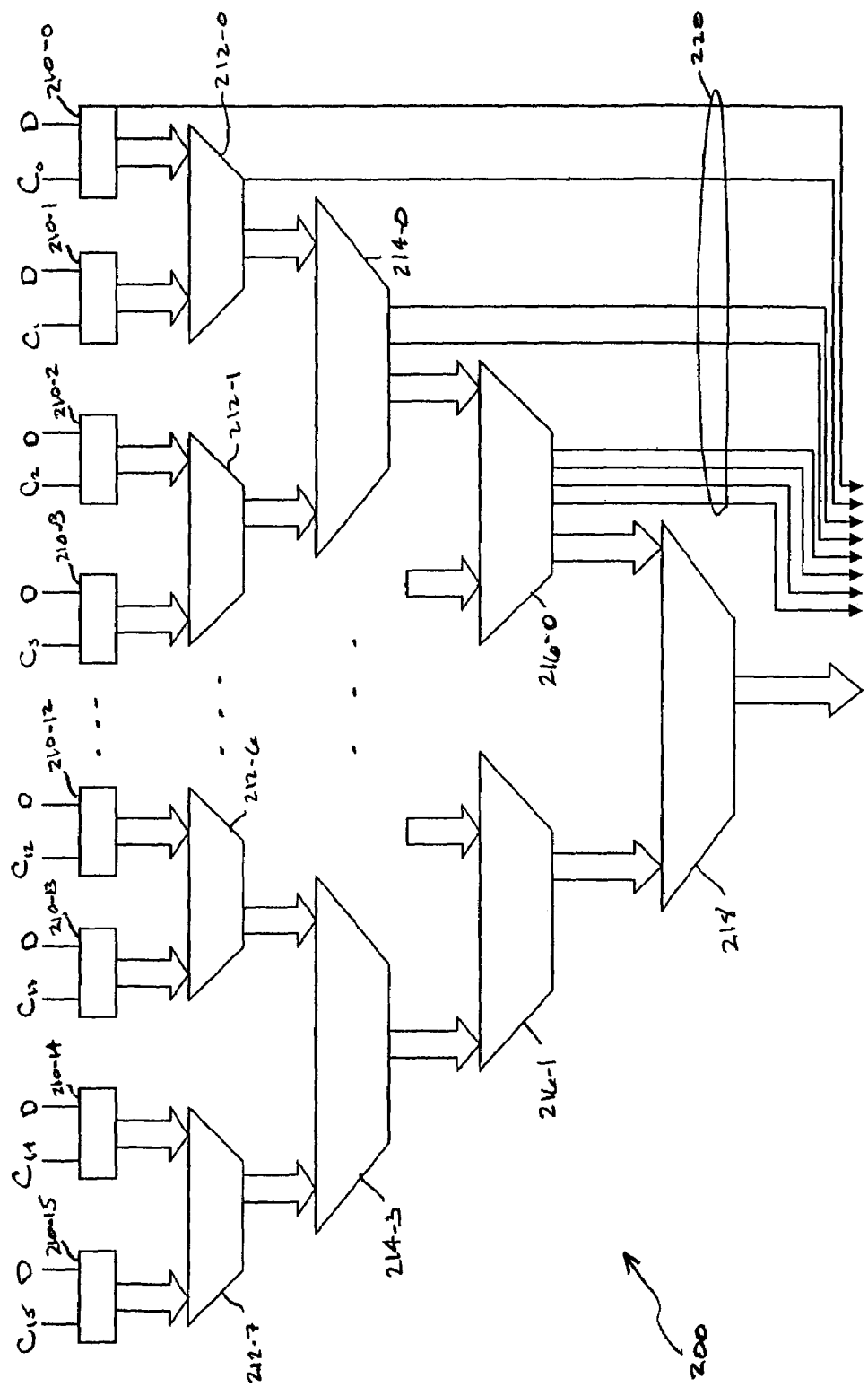
FIG. 2 illustrates a multiplier for carrying out the multiplication algorithm of FIG. 1.

FIG. 2 is a schematic drawing illustrating a multiplier 200 for carrying out the algorithm 100 on a 16 bit multiplier C and a 16 bit multiplicand D. A first level of multiplier 200 includes sixteen decoders 210-0 through 210-15. A second level includes 8, 17-bit adders 212-0 through 212-7. A third level of device 200 includes 4, 18-bit adders 214-0 through 214-3. A fourth level of multiplier 200 includes 2, 20-bit adders 216-0 and 216-1 and a final level of multiplier 200 includes a single, 24-bit adder 218.

As discussed above, in multiplying two numbers algorithm 100 first multiplies each bit of the multiplicand D by each bit of the multiplier C to generate a series of partial products. Thus, decoders 210-0 through 210-15 each carry out a series of multiplications of one bit of the multiplier C by each bit of the multiplicand D. For example, decoder 210-0 would multiply the first bit $C_0$ of 16-bit the multiplier C by each bit $D_0$–$D_{15}$ of the 16 bit multiplicand. Similarly, decoder 210-1 would multiply a second bit of the multiplier $C_1$ by each bit of multiplicand D. Decoders 210-2 through 210-15, respectively operate similarly on bits $C_2$ through $C_{15}$, respectively, of multiplier C. Additionally, it is to be understood that in each single operation, decoders 210-0 through 210-15 are multiplying two single binary bits. With respect to multiplication of two binary bits, the logical ANDing of the two bits will generate the same result as the multiplication of the two bits. Thus, decoders 210-0 through 210-15 may be implemented as logical AND gates.

Two contiguous partial products are then added together. In particular, the partial products generated by decoder 210-0 and 210-1 are summed by adder 212-0 and the partial products generated by decoder 210-2 and 210-3 are summed by adder 212-1. Similarly, partial products generated by the remaining contiguous decoders, 210-4 and 210-5, 210-6 and 210-7, 210-8 and 210-9, 210-10 and 210-11, 210-12 and 21-13, 210-14 and 21-15, respectively, are added by adders 212-2 through 212-7, respectively. The results from these additions are summed by adders 214-0 through 214-3 and the results of these additions are summed by adders 216-0 and 216-1, the results of which are in turn added by final adder 218 to provide a result.

As discussed above, before being summed, each partial product must be shifted to the left by a single bit with respect to the previous partial product. Thus, for a multiplication of two 16 bit numbers, there will be 16 partial products and 15 bits that were not included in the addition of two partial products and that must be carried through to the result. As shown in FIG. 2, carry lines 220 provide these additional bits to the final result.

Figure 3:
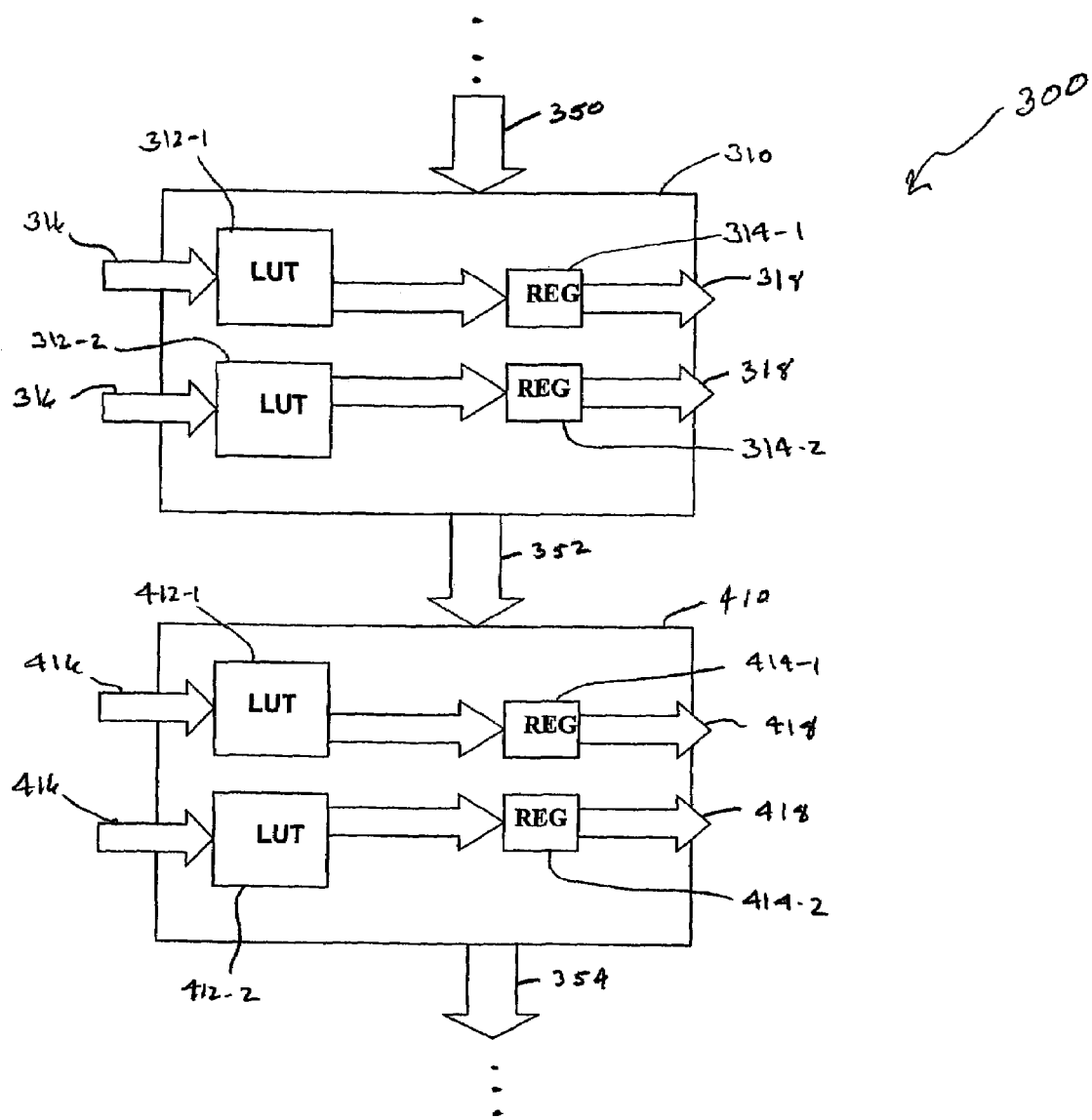
FIG. 3 is a block diagram of a portion of a programmable logic device including generalized logic elements.

Implementation of a multiplication algorithm such as multiplication algorithm 100 in a programmable logic device ("PLD") is discussed below. As discussed in the Background section, a typical PLD may include one or more combinatorial logic sections which may be implemented in look-up tables ("LUT"s) it is also considered that a combinatorial logic section be implemented as other devices that carry out combinatorial logic such as, without limitation, product terms. One or more sequential logic sections in a PLD may be implemented in one or more registers. FIG. 3 is a block diagram illustrating a portion of a generalized PLD 300 including a first generalized logic element 310 and a second generalized logic element 410. Though only two LE's are illustrated in FIG. 3, PLD 300 is considered to include additional LEs similar to LEs 310 and 410. First LE 310 includes a first LUT 312-1, a second LUT 312-2, a first register 314-1 and a second register 314-2. Inputs 316 drive LE 310 and may be directly coupled to LUTs 312-1 and 312-2 or may be coupled thereto through one or more multiplexers or other devices. LUTs 312-1 and 312-2 drive registers 314-1 and 314-2 either directly or through one or more multiplexers or other devices. Registers 314-1 and 314-2 drive LE outputs 318, again, either directly or through one or more multiplexers or other devices. It is also considered that LE 310 include other connections not shown in FIG. 3. For example, without limitation, LUT 312-1 and/or LUT 312-2 may drive outputs 318, bypassing registers 314-1 and 314-2. LE 410 includes first LUT 412-1, second LUT 412-2, first register 414-1, second register 414-2, inputs 416 and outputs 418 which are preferably interconnected substantially as LUTs 312-1 and 312-2, registers 314-1 and 314-2, inputs 316 and outputs 318.

Lines 350 to LE 310 can drive registers 314-1 and/or 314-2 from other LEs in PLD 300. Registers 314-1, 314-2 may be driven either by a register in another LE or a LUT in another LE directly or through one or more multiplexers or other devices. Similarly, lines 352 can be used to allow LUTs 312-1 and/or 312/2 and registers 314-1 and 314-2 to drive LUTs 412-1 and/or 412-1 and registers 414-1 and/or 414-2 of LE 410. It is also considered that lines 352 may be accessed by LEs in PLD 300 other than LE 310 to drive devices of LE 410. Lines 354 allows devices of LE 410 to drive other LEs in PLD 300.

As is understood in the art, to implement a multiplier such as multiplier 200 in a PLD, typically, the combinatorial logic sections, such as LUTs 312-1 and 312-2, of the PLD are programmed to carry out both function of the decoders and adders of the multiplier, such as decoders 210-0 through 210-15 and the adders 212-0 through 212-7, 214-0 through 214-3, 216-0, 216-1 and 218 of multiplier 200. As such, depending on the size of the numbers to be multiplied, the combinatorial logic sections of a number of LEs would likely be required to carry out a given multiplication.

Figures 4, 5:
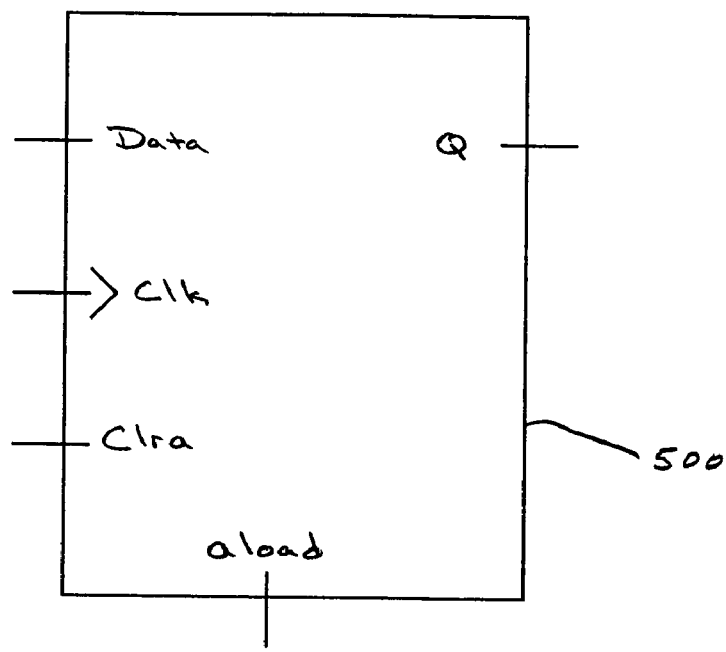
FIG. 4 is a diagram of an example of register that could be part of a logic element of FIG. 3.
FIG. 5 is a logic table illustrating a configuration of the register of FIG. 4 as an AND gate.

To reduce the number of combinatorial logic devices required to carry out a given multiplication and make increase utilization of the registers of LEs used in a multiplication, the registers of an LE are configured to function as AND gates to carry out the function of the decoders in the multiplication of two binary numbers. FIG. 4 is an illustration of a standard register 500. Register 500 includes a data input Data, an active low asynchronous clear input Clra, an active high asynchronous load input aload, and an output Q. If input aload is held high, and input Clra is low, then register 500 is cleared and output Q is low. If input aload is held high, and Clra is high, then the value of input Data is passed through to output Q. Thus, if input aload is held high, the truth table for register 500 is shown in FIG. 5. Specifically, when input aload is held high, driving the Data and Clra inputs low generates a low output Q, driving the Data input low and Clra input high generates a low output, driving the Data input high and Clra input low generates a low output, and driving the Data input and Clra input both high generates a high output. Thus, using the Data input and Clra inputs for two binary numbers, register 500 can be used as an AND gate. In this way, the registers of the LEs in a PLD may be configured as the decoders, such a decoders 210-0 through 210-15 of multiplier 200, in a multiplier.

Thus, to implement a multiplier such as multiplier 200 in PLD 300 as illustrated in FIG. 3, registers 314-1, 314-2, 414-1 and 414-2 are configured, along with additional registers not shown, as logical AND gates (the decoders of multiplier 200) and LUTs 312-1, 312-2, 412-1 and 412-2 are configured, along with LUTs not shown, as adders. The LUTs and registers so configured would then be interconnected, as is well understood in the art, to form a multiplier such as multiplier 200.

By configuring registers in a PLD as AND gates to carry out multiplication, relatively fewer LUTs need to be configured to carry out the multiplication. This frees up LUTs for other uses and can thereby increase the density of logic that can be carried out by a PLD. Additionally, though the configuration of a register to function as an logical AND gate is disclosed above in the context of configuration of a multiplier, it is also considered to configure one or more registers of a PLD as AND gates for carrying out functions other than multiplication.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed as new and desired to be protected by Letters Patent of the United States is:

1. A logic element configured to carry out at least a portion of a multiplication of a multiplicand and a multiplier, the logic element including:

a combinatorial logic section configured at least as an adder; and at least one register configured as a logical AND gate and that ANDs at least one bit of the multiplicand and one bit of the multiplier.

2. The logic element of claim 1 wherein the combinatorial logic section is configured to add at least a first partial product of the multiplication with at least a second partial product of the multiplication.

3. The logic element of claim 1 wherein the at least one register includes:
    a data input, a clear input, and a load input wherein the load input is held high, a first bit to be ANDed is input on the data input and a second bit to be ANDed is input on the clear input.

4. The logic element of claim 1 wherein the combinational logic section includes a look up table.

5. A programmable logic device including the logic element of claim 1.

6. A programmable logic device, comprising:
    a plurality of programmable logic elements arranged in an array, each of the plurality of logic elements including:
    combinatorial logic programmable to perform different logic functions: and
    at least one register interconnected with the combinatorial logic section wherein the at least one register is configured to operate as a logical AND gate and that ANDs at least one bit of a multiplicand and one bit of a multiplier.

7. The logic element of claim 6 wherein the at least one register includes:
    a data input, an clear input, and a load input, wherein the load input is held high, a first bit to be logically ANDed is input on the data input and a second bit to be logically ANDed is input on the clear input.

8. The logic element of claim 7 wherein the combinatorial logic section includes a look up table.

9. The logic element of claim 7 wherein the register carries out a portion of a multiplication of two numbers.

10. The logic element of claim 6, wherein the combinatorial logic is programmable to perform the functions of a decoder and an adder of a multiplier.

11. A method of carrying out at least a portion of a multiplication of two numbers in a programmable logic device including:
    configuring at least one register of the programmable logic device to logically AND at least a portion of the bits of the two number to generate at least a first partial product; and
    configuring at least one combinatorial logic section of the programmable logic device as an adder.

12. The method of claim 11 wherein configuring the at least one combinatorial logic section includes configuring the at least one combinatorial logic section to add at least a first partial product of the multiplication with at least a second partial product of the multiplication.

13. The method of claim 12 wherein configuring at least one register of the programmable logic device includes:
    holding a load input of the register in a logically high state,
    inputting a first bit of a first of the two numbers on the data input of the register; and
    inputting a first bit of the second of the two numbers on the clear input of the register.

14. The method of claim 13 wherein configuring the at least one combinatorial logic section includes configuring a look up table.

15. A method of configuring a register in a programmable logic device includes to function as a logical AND gate including:
    holding a load input of the register in a logically high state,
    inputting a first bit of a first of two numbers to be logically ANDed on the data input of the register; and
    inputting a first bit of a second of two numbers to be logically ANDed on the clear input of the register.

* * * * *